(12) United States Patent
Onishi

(10) Patent No.: US 8,693,707 B2
(45) Date of Patent: Apr. 8, 2014

(54) SIGNAL PROCESSING CIRCUIT

(75) Inventor: Akinobu Onishi, Ota (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 505 days.

(21) Appl. No.: 12/972,317

(22) Filed: Dec. 17, 2010

(65) Prior Publication Data

US 2011/0150239 A1    Jun. 23, 2011

(30) Foreign Application Priority Data

Dec. 18, 2009 (JP) ................................. 2009-287599

(51) Int. Cl.
  *H04R 3/00* (2006.01)
(52) U.S. Cl.
  USPC .............................. 381/111; 381/122; 381/174
(58) Field of Classification Search
  USPC .......................... 381/111, 113–114, 122, 174
  See application file for complete search history.

(56) References Cited

U.S. PATENT DOCUMENTS

| | | | | |
|---|---|---|---|---|
| 3,964,319 | A | * | 6/1976 | Fletcher et al. ................. 73/647 |
| 5,633,640 | A | | 5/1997 | Barker et al. |
| 5,699,004 | A | * | 12/1997 | Picciotto ...................... 327/350 |
| 7,894,616 | B2 | * | 2/2011 | Song et al. .................... 381/113 |
| 2003/0155484 | A1 | | 8/2003 | Wiles, Jr. |
| 2010/0329487 | A1 | * | 12/2010 | David et al. ................... 381/174 |
| 2011/0051954 | A1 | * | 3/2011 | Thomsen et al. ............... 381/93 |

FOREIGN PATENT DOCUMENTS

| | | |
|---|---|---|
| DE | 10 2009 043 799 A1 | 4/2010 |
| JP | 59-231456 A | 12/1984 |
| JP | 60-101836 U | 7/1985 |
| JP | 1-63232 U | 4/1989 |
| JP | 6-309443 A | 11/1994 |
| JP | 7-221645 | 8/1995 |
| JP | 8-289345 A | 11/1996 |
| JP | 2004-72224 | 3/2004 |
| JP | 2006-514497 A | 4/2006 |
| JP | 2008-054077 A | 3/2008 |
| WO | 2011/111125 A1 | 9/2011 |

OTHER PUBLICATIONS

Patent Abstracts of Japan for patent application with Publication No. 2004-072224, Publication Date: Mar. 4, 2004, 1 page.
Mechanical English translation for patent application with Publication No. 2004-072224, Publication Date: Mar. 4, 2004, 14 pages.
Patent Abstracts of Japan for patent application with Publication No. 07-221645, Publication Date: Aug. 18, 1995, 1 page.

(Continued)

*Primary Examiner* — Disler Paul
(74) *Attorney, Agent, or Firm* — Polansky & Associates, P.L.L.C.; Paul J. Polansky

(57) ABSTRACT

A signal processing circuit includes: an AD converter configured to quantize an input signal, whose amplitude changes in accordance with temperature, within a set voltage range and convert the quantized input signal into a digital signal; and a setting circuit configured to set the voltage range so as to be wider when the input signal is greater in amplitude in accordance with the temperature and so as to be narrower when the input signal is smaller in amplitude in accordance with the temperature.

6 Claims, 4 Drawing Sheets

(56) References Cited

OTHER PUBLICATIONS

Mechanical English translation for patent application with Publication No. 07-221645, Publication Date: Aug. 18, 1995, 10 pages.

Office Action issued in corresponding Japanese Application No. 2009-287599 dated Jan. 15, 2013, and English translation thereof (4 pages).

English abstract of Japanese Publication No. 60-101836 published on Jul. 11, 1985, 1 page.

Patent Abstracts of Japan, Publication No. 59-231456, Published on Dec. 26, 1984, 1 page.

English abstract of Japanese Publication No. 1-63232 published on Apr. 24, 1989, 1 page.

European Extended European Search Report for Application No. 10195269.5 dated Apr. 23, 2012 (12 pages).

Ovidiu Bajdechi et al., "A 1.8-V Modulator Interface for an Electret Microphone with On-Chip Reference", IEEE Journal of Solid-State Circuits, IEEE Service Center, Piscataway, NJ, USA, vol. 37, No. 3, Mar. 1, 2002 (4 pages).

Yasuno y et al., "Temperature Characteristics of Electric Condenser Microphones", Electrets, 2005. ISE-12. 2005 12th international Symposium on Salvador, Bahia, Brazil Sep. 11-14, 2005, Piscataway, NJ, USA, IEEE, Sep. 11, 2005 (2 pages).

Office Action issued in corresponding Japanese Application No. 2009-287599 dated Nov. 5, 2013 and English translation (4 pages).

Rudy Van de Plassche, Philips Research Laboratories, Eindhoven, The Netherlands, "Integrated Analog-to-Digital and Digital-to-Analog Converters", 1994 (8 pages).

\* cited by examiner

SIGNAL PROCESSING CIRCUIT

CROSS-REFERENCE TO RELATED APPLICATION

This application claims the benefit of priority to Japanese Patent Application No. 2009-287599, filed Dec. 18, 2009, of which full contents are incorporated herein by reference.

BACKGROUND OF THE INVENTION

1. Field of the Invention

The present invention relates to a signal processing circuit.

2. Description of the Related Art

A full-scale voltage of an AD converter is determined by a product of the number of bits and a voltage of one LSB (Least Significant Bit) of the AD converter. Generally, this full-scale voltage is set based on a reference voltage input to the AD converter (see, e.g., Japanese Patent Laid-Open Publication Nos. 1995-221645 and 2004-72224).

In the AD converter described above, as the reference voltage changes, the full-scale voltage changes. For this reason, generally, such voltage is used as the reference voltage that is of high accuracy and does not change in its voltage level due to ambient temperature, noise, etc.

By the way, for example, a signal from a capacitor microphone such as a MEMS (Micro Electro Mechanical System) microphone changes not only according to audio input to the MEMS microphone but also according to the temperature. For this reason, in the case of processing the signal from the MEMS microphone by the AD converter, the amplitude of the signal input to the AD converter can possibly increase due to a temperature rise, as shown, for example, in FIG. 5. In such a case, if the full-scale voltage is constant, the input signal cannot be quantized with accuracy.

SUMMARY OF THE INVENTION

A signal processing circuit according to an aspect of the present invention, includes: an AD converter configured to quantize an input signal, whose amplitude changes in accordance with temperature, within a set voltage range and convert the quantized input signal into a digital signal; and a setting circuit configured to set the voltage range so as to be wider when the input signal is greater in amplitude in accordance with the temperature and so as to be narrower when the input signal is smaller in amplitude in accordance with the temperature.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which:

FIG. 3 is a diagram of a configuration of an AD converter 30a;

DETAILED DESCRIPTION OF THE INVENTION

At least the following details will become apparent from descriptions of this specification and of the accompanying drawings.

Figure 1:
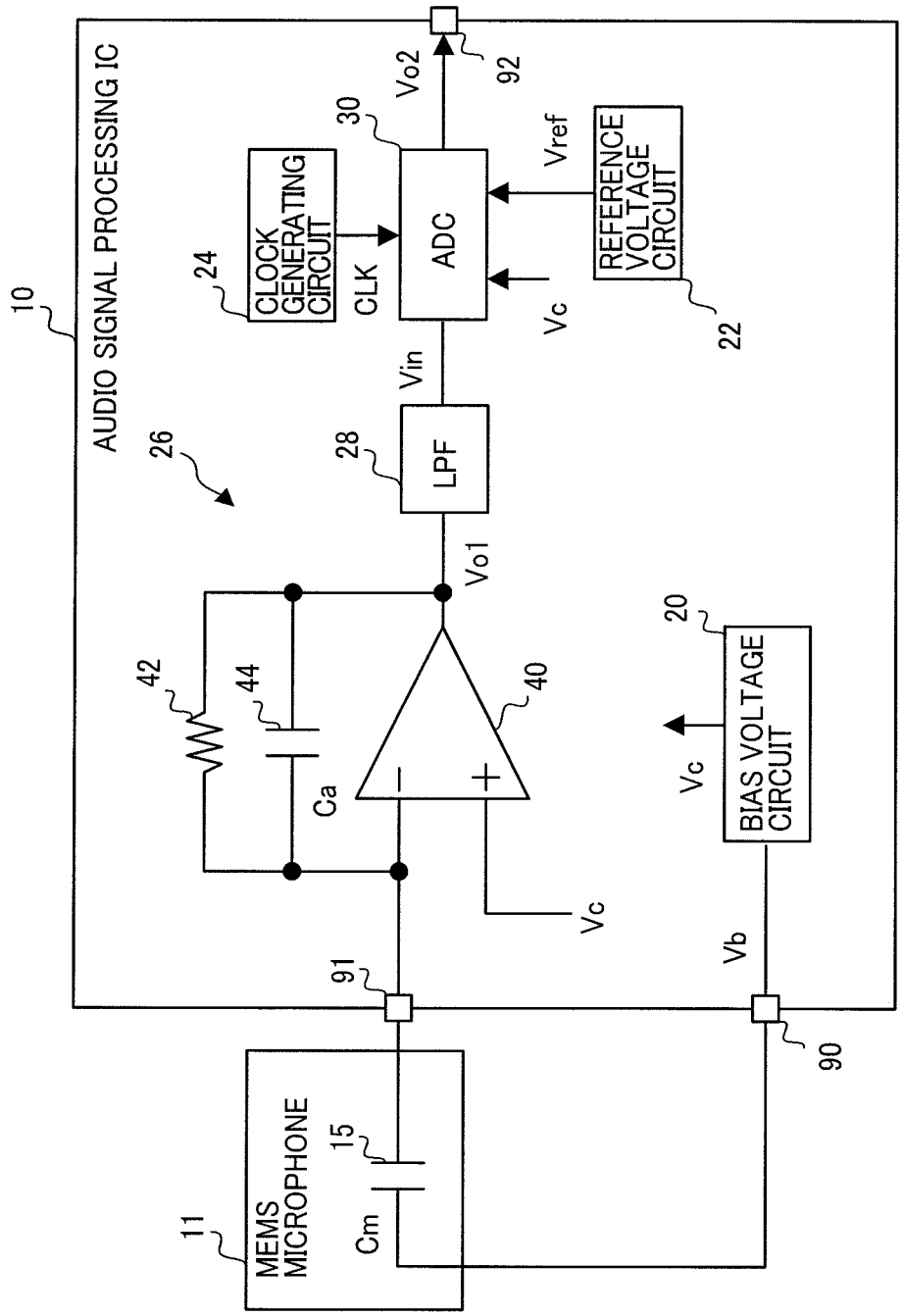
FIG. 1 is a diagram of a configuration of an audio signal processing IC 10 as one embodiment of the present invention.

FIG. 1 denotes a configuration of an audio signal processing IC (Integrated Circuit) 10 as one embodiment of the present invention. The audio signal processing IC 10, which is a circuit that amplifies, digitizes, and outputs the audio detected by, for example, a MEMS microphone 11, is configured to include a bias voltage circuit 20, a reference voltage circuit 22, a clock generating circuit 24, an amplifying circuit 26, an LPF (Low Pass Filter) 28, an AD converter (ADC: Analog to Digital Converter) 30, and terminals 90 to 92. The reference voltage circuit 22 and the AD converter 30 correspond to a signal processing circuit.

The MEMS microphone 11, disposed between the terminals 90 and 91, is a capacitor microphone that generates a signal according to the audio and is configured to include a capacitor 15 whose capacitance value changes according to the audio. One end of the capacitor 15 is connected to the terminal 90 and the other end thereof is connected to the terminal 91. The MEMS microphone 11 performs its desired operation with a voltage Vb of a predetermined level applied to one end of the capacitor 15. In this embodiment, the capacitance value of the capacitor 15 is given as Cm.

For example, the capacitance value of the capacitor 15 increases according to a temperature rise. Further, as the temperature rises, out of the audio input to the MEMS microphone 11, for example, the level of the audio that is attenuated in the inside (not shown) of the MEMS microphone 11 becomes small. Such phenomenon, etc., cause the sensitivity of the MEMS microphone 11 to be raised according to the temperature rise. Therefore, even if the level of the audio input to the MEMS microphone 11 is constant, when the temperature rises, the MEMS microphone 11 outputs a large signal as compared with the signal at normal temperature time.

The bias voltage circuit 20 generates voltages Vb and Vc of predetermined levels. The voltage Vb is a voltage to drive the capacitor 15 and the voltage Vc is a voltage (signal ground) as a reference at the time of signal processing by the audio signal processing IC 10.

The reference voltage circuit 22 (setting circuit) generates, for example, a reference voltage Vref that goes to a higher level according to the temperature rise. Details of the reference voltage circuit 22 will be described later.

The clock generating circuit 24 outputs a clock signal CLK of a predetermined period to the AD converter 30.

The amplifying circuit 26 is a circuit that amplifies and outputs the audio detected by the capacitor 15 and is configured to include an operational amplifier 40, a resistor 42, and a capacitor 44.

The capacitor 15 is connected to an inverting input terminal of the operational amplifier 40 by way of the terminal 91. The resistor 42 and the capacitor 44 are connected between the inverting input terminal and an output terminal of the operational amplifier 40. The resistor 42 is a feedback resistor to make a dc level of the inverting input terminal and the output terminal of the operational amplifier 40 equal to the voltage Vc applied to a non-inverting input terminal. In this embodiment, the impedance of the resistor 42 is designed to be sufficiently greater than the impedance of the capacitor 44.

For this reason, the voltage Vb applied to the capacitor 15 is inversely amplified by a gain to be determined by a ratio of the capacitor 15 to the capacitor 44. For example, if the capacitance value of the capacitor 44 is given as Ca and the voltage of the output terminal of the operational amplifier 40 is given as Vo1, then the voltage Vo1 is expressed as follow:

$$Vo1 = -(Cm/Ca) \times Vb \qquad (1)$$

Therefore, for example, if the capacitance value of the capacitor 15 increases by ΔCm, ΔVout1 as a variation of the output voltage Vout1 becomes ΔVout1=−(ΔCm/Ca)×Vb1. Even if the level of the audio input to the MEMS microphone 11 is constant, when the temperature rises and, for example, the capacitance value Cm increases, the amplitude of the voltage Vo1 increases.

The LPF 28 is a filter to suppress a high frequency component of the voltage Vo1 output from the amplifier 26 and prevent folding noise at the AD converter 30.

The AD converter 30 quantizes an input voltage Vin input from the LPF 28 with timing synchronized with that of the clock signal CLK within a voltage range to be set and outputs it to the terminal 92. The input voltage Vin changes with the voltage Vc at the center. While details will be described later, the voltage range to be set is, for example, a range of the voltage Vc±Vfs or a range of 0V (ground voltage) to a full-scale voltage Vfs. The full-scale voltage Vfs in this embodiment increases according to an increase of the reference voltage Vref. A digital signal Vo2 output from the terminal 92 is processed by, for example, a microcomputer (not shown), etc.

<Details of Reference Voltage Circuit 22>

Figure 2:
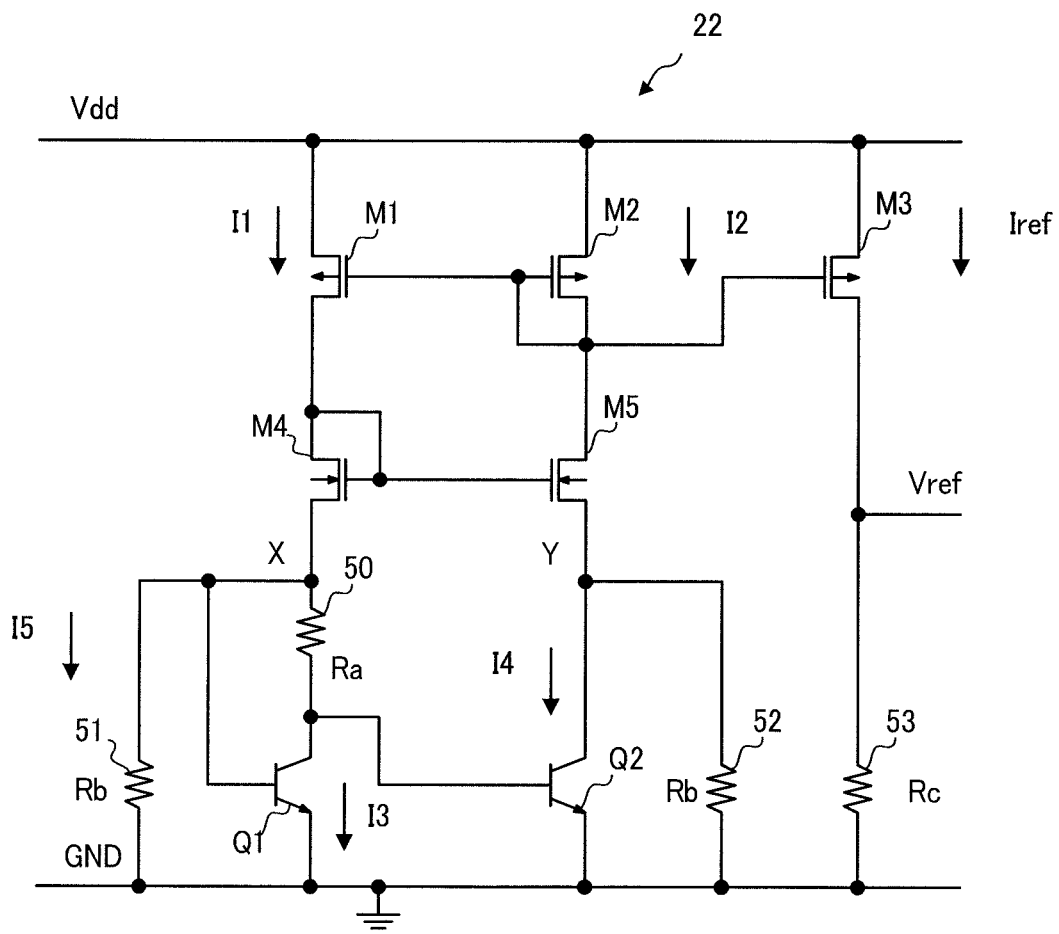
FIG. 2 is a diagram of a configuration of a reference voltage circuit 22.

Details will now be described of the reference voltage circuit 22 with reference to FIG. 2. The reference voltage circuit 22 is a circuit to output the reference voltage Vref that increases according to the temperature rise and is configured to include PMOS transistors M1 to M3, NMOS transistors M4 and M5, NPN transistors Q1 and Q2, and resistors 50 to 53. Here, it is assumed, for example, that the PMOS transistors M1 to M3 are of a same size and that the NMOS transistors M4 and M5 are of a same size. Further, it is assumed that the NPN transistor Q2 contains K pieces of NPN transistors of the same size as that of the NPN transistor Q1. The resistors 50 to 53 are resistors of a same kind (manufacturing process).

The gate of the PMOS transistor M1 is connected to the gate of the diode-connected PMOS transistor M2 and the drain of the NMOS transistor M5. The gate of the diode-connected NMOS transistor M4 is connected to the drain of the PMOS transistor M1 and the gate of the NMOS transistor M5. For this reason, a current I1 running through the PMOS transistor M1 is bootstrapped by, and is made equal to, a current M1 running through the PMOS transistor M2. As a result, the voltages of the sources of the NMOS transistors M4 and M5 are made equal. A node to which the source of the NMOS transistor M4 and the resistor 50 are connected is given as a node X and a node to which the source of the NMOS transistor M5 and the collector of the NPN transistor Q2 are connected is given as a node Y.

The base of the NPN transistor Q2 and one end of the resistor 50 are connected to the collector of the NPN transistor Q1. The base of the NPN transistor Q1 is connected to the other end of the resistor 50 and one end of the resistor 51. The collector of the NPN transistor Q2 is connected to one end of the resistor 52 and the source of the NMOS transistor M5. The resistance value of the resistor 50 is given as Ra, the resistance values of the resistors 51 and 52 being equal and given as Rb, and the resistance value of the resistor 53 being given as Rc. Further, if the current running through the NPN transistor Q1 is given as I3, the base-emitter voltage of the NPN transistor Q1 being given as Vbe1, and the base-emitter voltage of the NPN transistor Q2 being given as Vbe2, then $$Vbe1 = Vbe2 + Ra \times I3 \qquad (2)$$

As described above, since the currents I3 and I4 are equal and the NPN transistor Q2 contains K pieces of NPN transistors of the same size as that of the NPN transistor Q1, the following is valid between the base-emitter voltage Vbe1 and the base-emitter voltage Vbe2:

$$Vbe1 - Vbe2 = V_T \ln K \qquad (3)$$

where $V_T$ represents thermal voltage and ln represents natural logarithm.

Therefore, the current I3 is obtained as follows:

$$I3 = (V_T/Ra) \times \ln K \qquad (4)$$

If the current running through the resistor 51 is given as I5, there is the following relationship between the current I1 and the currents I3 and I5:

$$I1 = I3 + I5 \qquad (5)$$

and as a result, the current I1 becomes as follows:

$$I1 = (Vbe1/Rb) + (V_T/Ra) \times \ln K \qquad (6)$$

The PMOS transistor M3 and the PMOS transistor M2 make up a current mirror. This makes a current Iref running through the PMOS transistor M3 equal to the current I2 and further, to the current I1. Here, if the resistance value of the resistor 53 is given as Rc, the reference voltage Vref becomes as follows that is output from the node to which the resistor 53 and the PMOS transistor M3 are connected:

$$Vref = Iref \times Rc$$

$$= (Rc/Rb) \times (Vbe1 + V_T \times (Rb/Ra) \times \ln K) \qquad (7)$$

The temperature coefficient of the base-emitter voltage Vbe1 is negative (about −2mV/° C.) and the temperature coefficient of the thermal voltage $V_T$ is positive (about 0.09 mV/° C.). For this reason, the reference voltage Vref can be made a desired temperature coefficient by, for example, adjusting the value of the Rb/Ra. In this embodiment, for example, the Rb/Ra is adjusted so that the reference voltage Vref will have the positive temperature coefficient. The size of the PMOS transistors M1 to M3, the NMOS transistors M4 and M5, etc., and the current value of the currents I1 to I3 are freely settable, under the conditions that make the equation (7) valid.

<First Embodiment of AD Converter 30>

Figure 3:
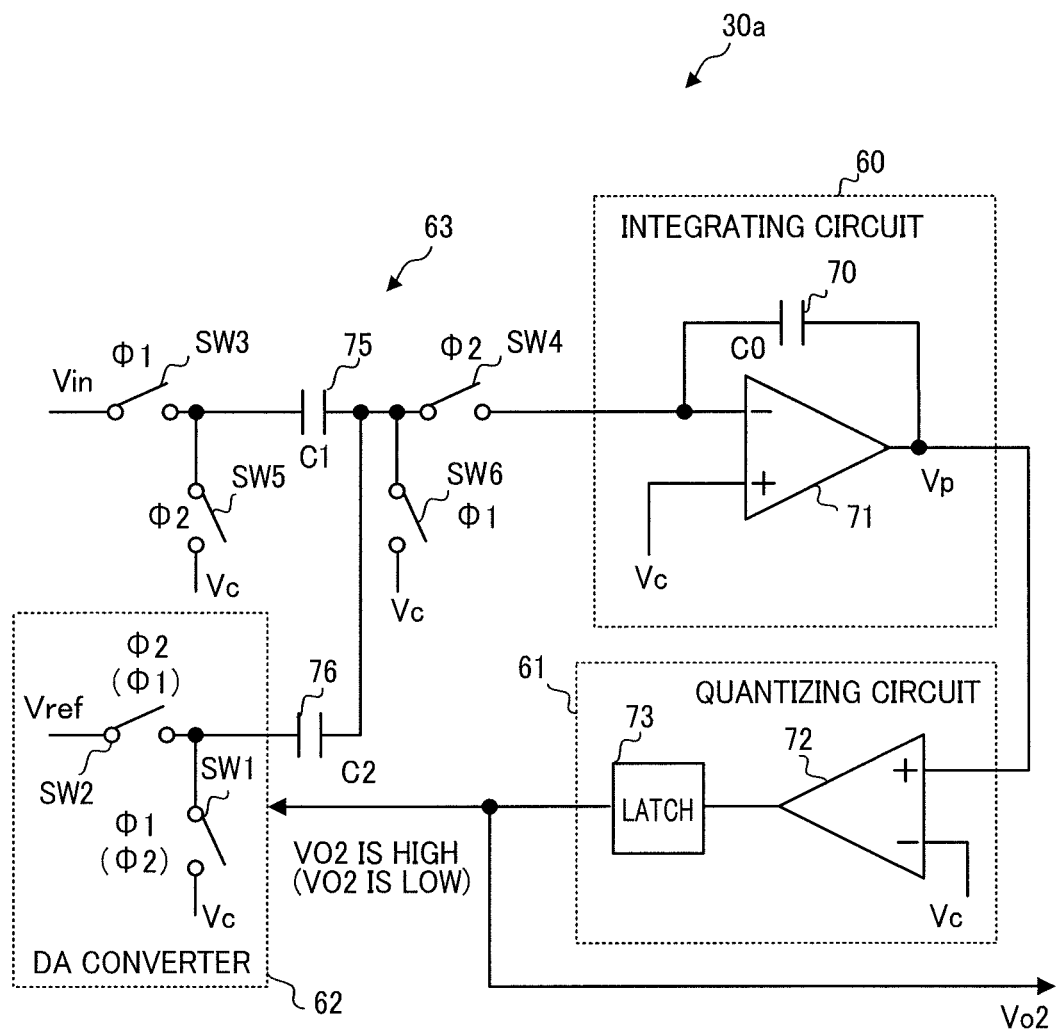

An AD converter 30a will now be described that is a first embodiment of the AD converter 30 with reference to FIG. 3. The AD converter 30a is an AD converter of the Delta-Sigma system (ΔΣ AD converter) and is configured to include an integrating circuit 60, a quantizing circuit 61, a DA converter 62, and an adding circuit 63. A clock signal CLK is input to the AD converter 30a and all blocks of the AD converter 30a excluding the integrating circuit 60 operate in synchronization with the clock signal CLK.

The integrating circuit 60 is configured to include a capacitor 70 and an operational amplifier 71, with the capacitor 70 being connected between an inverting input terminal and an output terminal of the operational amplifier 71. A voltage Vc is applied to a non-inverting input terminal of the operational amplifier 71.

The quantizing circuit 61 is configured to include a comparator 72 and a latch circuit 73. The comparator 72 compares the voltage Vc and the output of the operational amplifier 71. The latch circuit 73 latches the output of the comparator 72, for example, at the rising edge of the clock signal CLK. A digital signal output from the latch circuit 73 is given as a signal Vo2.

The DA converter 62 is a one-bit DA converter and outputs the analog reference voltage Vref to the adding circuit 63, based on the signal Vo2 from the latch circuit 73. The DA converter 62 is configured to include switches SW1 and SW2.

The voltage Vc is applied to one end of the switch SW1 and the other end thereof is connected to a capacitor 76. The switch SW1 is on during a period in which the signal Vo2 is high and the clock signal CLK is high or a period in which the signal Vo2 is low and the clock signal CLK is low. Hereinafter, the period in which the clock signal CLK is high is referred to as period 91 and the period in which the clock signal CLK is low is referred to as period ϕ2.

The reference voltage Vref is applied to one end of the switch SW2 and the other end thereof is connected to the capacitor 76. The switch SW2 is on in period 92 when the signal Vo2 is high or in period ϕ1 when the signal Vo2 is low.

The adding circuit 63 adds the voltage corresponding to the input voltage Vin and the voltage corresponding to the reference voltage Vref for outputting to the integrating circuit 60. The adding circuit 63 is configured to include switches SW3 to SW6 and capacitors 75 and 76.

The input voltage Vin is applied to one end of the switch SW3 and the other end thereof is connected to one end of the capacitor 75. The switch SW4 is connected between the capacitor 75 and the inverting input terminal of the operational amplifier 71. The voltage Vc is applied to one end of the switch SW5 and the other end thereof is connected to one end of the capacitor 75. The voltage Vc is applied to one end of the switch SW6 and the other end thereof is connected to the other end of the capacitor 75. The switches SW3 and SW6 are on in period ϕ1 and the switches SW4 and SW5 are on in period ϕ2.

The operation will now be described of the AD converter 30a. Here, the capacitance values of the capacitors 70, 75, and 76 are given as C0, C1, and C2, respectively. The case will now be described of the signal Vo2 being high. In period ϕ1, since the switches SW3 and SW6 are on, the capacitor 75 is charged. Since the switch SW1 is on, the voltages at both ends of the capacitor 76 become the voltage Vc and the capacitor 76 is discharged. In period ϕ2, since the switches SW3 and SW6 are off and the switches SW4 and SW5 are on, the charge of the capacitor 75 moves to the capacitor 70. Since the switch SW1 is off and the switch SW2 is on, the capacitor 70 is discharged by way of the capacitor 76. As a result, after elapse of periods ϕ1 and ϕ2 (one cycle), a voltage Vp at the output terminal of the operational amplifier 71 changes by ΔVp.

$$\Delta Vp = (C1/C0) \times Vin - (C2/C0) \times Vref \quad (8)$$

The case of the signal Vo2 being low is the same as the case of the signal Vo2 being high and as a result, ΔVp becomes as follows:

$$\Delta Vp = (C1/C0) \times Vin + (C2/C0) \times Vref \quad (9)$$

Thus, the AD converter 30a, which is capable of changing the voltage Vp of the integrating circuit 60 according to the level of the signal Vo2 as the output signal of the quantizing circuit 61, operates as the ΔΣ AD converter (ΔΣ modulating circuit). The full-scale voltage Vfs in the ΔΣ AD converter is determined based on the condition of ΔVp=0. For this reason, in this embodiment, the full-scale voltage Vfs becomes as follows:

$$Vfs = (C2/C1) \times Vref \quad (10)$$

Here, since the capacitors 70, 75, and 76 are the capacitors of the same kind (manufacturing process), a ratio of their capacitance values does not change according to the temperature. Therefore, the full-scale voltage in the AD converter 30a changes in the same way as the temperature change of the reference voltage Vref. Since the signal ground in the AD converter 30a is the voltage Vc, the reference of the input voltage Vin and the full-scale voltage Vfs is the voltage Vc. For this reason, the range in which the AD converter 30a can quantize the input voltage Vin that changes with the voltage Vc at the center is the range of the voltage Vc±Vfs. As described above, since the reference voltage Vref increases according to the temperature rise, the full-scale voltage Vfs increases according to the temperature rise. The operational amplifier 71 may be a fully-differential operational amplifier.

<Second Embodiment of AD Converter 30>

Figure 4:
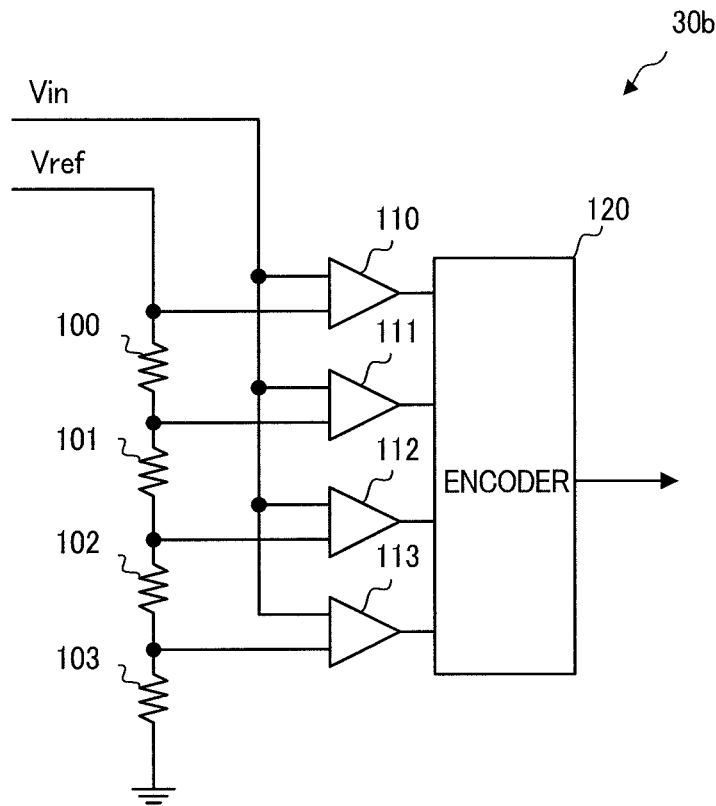
FIG. 4 is a diagram of a configuration of an AD converter 30b.
Figure 5:
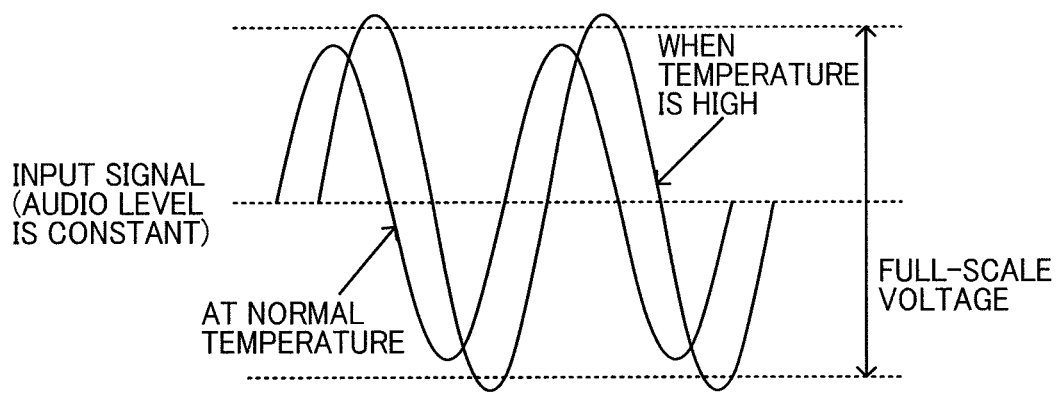
FIG. 5 is a diagram of a relationship between an input signal becoming greater due to a temperature rise and a full-scale voltage.

An AD converter 30b will now be described that is a second embodiment of the AD converter 30 with reference to FIG. 4. The AD converter 30b is a so-called flash AD converter and is configured to include resistors 100 to 103, comparators 110 to 113, and an encoder 120. The clock signal CLK is input to the AD converter 30b and all blocks of the AD converter 30b excluding the resistors 100 to 103 operate in synchronization with the clock signal CLK.

The resistors 100 to 103 are resistors of the same resistance value and are connected in series. The reference voltage Vref is applied to the resistor 100 side of the series-connected resistors 100 to 103 and 0V is applied to the resistor 103 side thereof.

The comparator 110 compares the reference voltage Vref and the input voltage Vin to see which is greater. The comparator 111 compares Vref×¾ with the reference voltage Vref divided and the input voltage Vin to see which is greater. The comparator 112 compares Vref×2/4 and the input voltage Vin to see which is greater. The comparator 113 compares Vref×¼ and the input voltage Vin to see which is greater.

The encoder 120 encodes the resultant output of the comparators 110 to 113 and outputs it as a digital signal.

In such an AD converter 30b, the full-scale voltage Vfs matches the reference voltage Vref. That is to say, because of Vfs=Vref, the full-scale voltage Vfs changes according to the reference voltage Vref. The range in which the AD converter 30b can quantize the input voltage Vin is the range of 0V to the full-scale voltage Vfs.

<Operation of Audio Signal Processing IC 10>

The operation will be described of the audio signal processing IC 10 when the temperature of the MEMS microphone 11 changes. Here, it is assumed that the AD converter 30a is used. In this embodiment, it is assumed that the reference voltage Vref is designed so that the full-scale voltage Vfs of the AD converter 30a will be greater by the order of, for example, several dB than a maximum value of the input voltage Vin input to the AD converter 30a at normal temperature (25° C.). For this reason, without temperature change, the AD converter 30a can appropriately quantize the input voltage Vin.

The case will now be described of the temperature becoming higher than the normal temperature. As described above, as the temperature rises, the capacitance value Cm of the capacitor 15 increases and therefore, the voltage Vo1 output from the amplifying circuit 26 becomes greater. For this reason, the input voltage Vin input to the AD converter 30a becomes greater. As the temperature rises, the reference voltage circuit 22, which generates the reference voltage Vref as the positive temperature coefficient, increases the level of the reference voltage Vref. Therefore, the full-scale voltage Vfs likewise becomes greater.

The case will then be described of the temperature becoming lower than the normal temperature. As the temperature falls, the capacitance value Cm of the capacitor 15 decreases and therefore, the voltage Vo1 output from the amplifying circuit 26 becomes smaller. For this reason, the input voltage Vin input to the AD converter 30a becomes smaller. At this moment, the reference voltage circuit 22 decreases the level of the reference voltage Vref. Therefore, the full-scale voltage Vfs likewise becomes smaller.

In this embodiment, for example, the value of the resistors 50 and 51 of the reference voltage circuit 22 is adjusted so that the full-scale voltage Vfs will always be greater than the maximum amplitude of the input voltage Vin in the temperature range in which the audio signal processing IC 10 operates. For this reason, this embodiment is capable of quantizing the input voltage Vin accurately even if the input voltage Vin changes according to the temperature.

The above has described the audio signal processing IC 10 of this embodiment. The AD converter 30 quantizes the input voltage Vin within the voltage range determined by the full-scale voltage Vfs to be set. In this embodiment, when the input voltage Vin becomes greater according to the temperature rise, the reference voltage circuit 22 makes the full-scale voltage Vfs greater. That is to say, the voltage range in which the AD converter 30 performs quantization is set to become wider according to the temperature rise. When the input voltage Vin becomes smaller according to the temperature fall, the reference voltage circuit 22 makes the full-scale voltage Vfs smaller. That is to say, the voltage range in which the AD converter 30 performs quantization is set to become narrower according to the temperature fall. Therefore, this embodiment is capable of quantizing the input voltage Vin accurately even if the input voltage Vin changes according to the temperature.

The amplitude of the full-scale voltage Vfs of the AD converter 30 is set based on the level of the reference voltage Vref as shown by, for example, the equation (10). The reference voltage circuit 22 generates such reference voltage Vref that makes the full-scale voltage Vfs greater when the input voltage Vin becomes greater and makes the full-scale voltage Vfs smaller when the input voltage Vin becomes smaller. Thus, the reference voltage circuit 22, which changes the reference voltage Vref to set the full-scale voltage Vfs, is capable of quantizing the input voltage Vin accurately even if the input voltage Vin changes according to the temperature.

In this embodiment, the temperature coefficient of the reference voltage Vref is designed so that the input voltage Vin will be included in the voltage range in which to quantize, for example, so that the amplitude of the input voltage Vin will be smaller than the amplitude of the full-scale voltage Vfs, in the temperature range in which the audio signal processing IC 10 operates. For this reason, this embodiment is capable of surely quantizing the input voltage Vin even if the input voltage Vin changes according to the temperature.

For example, the AD converter 30a of the Delta-Sigma system is used as the AD converter that sets the full-scale voltage Vfs based on the reference voltage Vref. Such an AD converter 30a is capable of setting the full-scale voltage Vfs by causing the DA converter 62 to output the reference voltage Vref.

The audio signal processing IC 10 outputs the voltage Vo1 according to the capacitance value of the capacitor 15 whose capacitance value changes according to the audio and the temperature. Further, the voltage Vo1 is output to the AD converter 30 as the input voltage Vin after its high frequency component is suppressed by the LPF 28. Therefore, the audio signal processing IC 10 is capable of converting the audio detected by the MEMS microphone 11 to the digital signal accurately even if the temperature changes.

For example, when the signal from the MEMS microphone 11 gets smaller due to the temperature rise, the reference voltage circuit 22 may be designed so that the level of the reference voltage Vref becomes smaller according to the temperature rise, namely, so that the reference voltage Vref of the equation (7) is set as the negative temperature coefficient. The audio signal processing IC 10 can quantize the signal to be input accurately by designing the temperature coefficient of the reference voltage Vref as above.

The microphone connected to the audio signal processing IC 10 may be, for example, a general electret condenser microphone (ECM).

The AD converter 30, only required to be capable of setting the full-scale voltage Vfs based on the reference voltage Vref to be input, may be, for example, of other type such as a successive-approximation type.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A signal processing circuit comprising:
    an AD converter configured to quantize an input signal, whose amplitude changes in accordance with temperature, within a set voltage range and convert the input signal into a digital signal;
    a setting circuit configured to set the voltage range so as to be wider when the input signal is greater in amplitude in accordance with the temperature and so as to be narrower when the input signal is smaller in amplitude in accordance with the temperature;
    an audio signal output circuit configured to output an audio signal corresponding to a capacitance value of a capacitor whose capacitance value changes in accordance with audio and temperature; and
    a low pass filter configured to suppress a high frequency component of the audio signal and output the audio signal to the AD converter as the input signal.

2. The signal processing circuit of claim 1, wherein
    in the AD converter, the voltage range is set based on the level of an input reference voltage, and wherein
    the setting circuit includes a reference voltage circuit configured to generate the reference voltage for setting the voltage range so as to be wider when the input signal is greater in amplitude in accordance with the temperature and so as to be narrower when the input signal is smaller in amplitude in accordance with the temperature.

3. The signal processing circuit of claim 2, wherein
    the reference voltage circuit generates the reference voltage for setting the voltage range such that the input signal falls within the voltage range.

4. The signal processing circuit of claim 2, wherein the AD converter is a delta-sigma AD converter including:
    an integrating circuit configured to integrate an input signal;
    a quantizing circuit configured to quantize an output of the integrating circuit and output the digital signal;
    a DA converter configured to output the reference voltage based on the digital signal; and
    an adding circuit configured to add a voltage corresponding to the input signal and a voltage corresponding to the reference voltage to output an added result to the integrating circuit.

5. The signal processing circuit of claim 3, wherein
The AD converter is a delta-sigma AD converter including:
an integrating circuit configured to integrate an input signal;
a quantizing circuit configured to quantize an output of the integrating circuit and output the digital signal;
a DA converter configured to output the reference voltage based on the digital signal; and
an adding circuit configured to add a voltage corresponding to the input signal and a voltage corresponding to the reference voltage to output an added result to the integrating circuit.

6. A signal processing circuit comprising:
an AD converter configured to quantize an input signal within a set voltage range and convert the input signal into a digital signal;
a setting circuit configured to set the voltage range so as to be wider when the input signal is greater in amplitude in accordance with the temperature and so as to be narrower when the input signal is smaller in amplitude in accordance with the temperature; and
an audio signal output circuit configured to output an audio signal to the AD converter as the input signal, the audio signal corresponding to a capacitance value of a capacitor whose capacitance value changes in accordance with audio and temperature.

* * * * *

UNITED STATES PATENT AND TRADEMARK OFFICE
CERTIFICATE OF CORRECTION

PATENT NO. : 8,693,707 B2
APPLICATION NO. : 12/972317
DATED : April 8, 2014
INVENTOR(S) : Akinobu Onishi It is certified that error appears in the above-identified patent and that said Letters Patent is hereby corrected as shown below:

In the Specification

Column 3, line 51, replace "M1" with "I2".

Column 5, line 14, replace "91" with "φ1".

Column 5, line 18, replace "92" with "φ2".

Signed and Sealed this
Sixteenth Day of September, 2014

Michelle K. Lee
*Deputy Director of the United States Patent and Trademark Office*